United States Patent
Martin et al.

(10) Patent No.: US 8,037,926 B2
(45) Date of Patent: Oct. 18, 2011

(54) METHOD AND APPARATUS FOR CHIP COOLING

(75) Inventors: Yves C. Martin, Ossining, NY (US); Lubomyr T. Romankiw, Briarcliff Manor, NY (US); Theodore G. Van Kessel, Millbrook, NY (US)

(73) Assignee: International Business Machines Corporation, Armonk, NY (US)

(*) Notice: Subject to any disclaimer, the term of this patent is extended or adjusted under 35 U.S.C. 154(b) by 177 days.

(21) Appl. No.: 11/766,533

(22) Filed: Jun. 21, 2007

(65) Prior Publication Data

US 2008/0314565 A1 Dec. 25, 2008

(51) Int. Cl.
    *H05K 7/20* (2006.01)
(52) U.S. Cl. ............ 165/80.4; 165/104.33; 165/908
(58) Field of Classification Search ........ 165/80.4, 165/911; 361/699
    See application file for complete search history.

(56) References Cited

U.S. PATENT DOCUMENTS

| | | | | |
|---|---|---|---|---|
| 3,613,392 A * | 10/1971 | Di Tucci | | 62/184 |
| 4,635,709 A | 1/1987 | Altoz | | |
| 5,183,104 A * | 2/1993 | Novotny | | 165/104.33 |
| 5,478,419 A * | 12/1995 | Dumas et al. | | 148/672 |
| 5,761,035 A * | 6/1998 | Beise | | 361/699 |
| 6,050,101 A * | 4/2000 | Liu | | 62/280 |
| 6,349,760 B1 * | 2/2002 | Budelman | | 165/80.4 |
| 6,837,063 B1 | 1/2005 | Hood, III et al. | | |
| 6,886,345 B2 * | 5/2005 | Ritland | | 60/775 |
| 7,055,341 B2 * | 6/2006 | Nori et al. | | 62/259.2 |
| 2002/0163782 A1 * | 11/2002 | Cole et al. | | 361/700 |
| 2004/0250562 A1 * | 12/2004 | Adiga et al. | | 62/259.2 |
| 2004/0250999 A1 * | 12/2004 | Kramer et al. | | 165/104.27 |
| 2006/0198407 A1 * | 9/2006 | Ungar | | 372/35 |

* cited by examiner

*Primary Examiner* — Allen Flanigan

(57) ABSTRACT

In one embodiment, the invention is a method and apparatus for chip cooling. One embodiment of a system for cooling a heat-generating device, such as a semiconductor chip, includes a vaporization chamber for at least partially vaporizing a stream of liquid in a stream of a gas to produce a mixture of gas, vapor and liquid and a heat sink coupled to the vaporization chamber for transferring heat from the heat-generating device to the mixture.

18 Claims, 3 Drawing Sheets

METHOD AND APPARATUS FOR CHIP COOLING

BACKGROUND OF THE INVENTION

The present invention relates generally to a microprocessor chips, and relates more particularly to systems for cooling microprocessor chips.

The evolution toward high-powered microprocessor chips has driven the design of heat sinks to cool the chips. Conventional heat sinks for cooling microprocessor chips typically come in two forms: air-cooled systems and liquid-cooled systems. Air-cooled systems employ large fins in order to maximize the area for heat transfer between solid (i.e., the fins) and gas (i.e., the air) and thick bases in order to spread the heat from the chip to the fins. Both of these characteristics limit the efficiency of a system. In addition, due to their large sizes, air-cooled systems require a large amount of the available space (e.g., up to approximately twenty-five percent) within an enclosure (e.g., a central processing unit housing or blade server computer), placing severe restrictions on the number of electronics that can be contained within a standard enclosure.

Liquid-cooled systems are more efficient at transporting heat and typically have smaller fins and thinner bases with lateral dimensions that more closely match those of a chip. However, liquid-cooled systems may be susceptible to leaks, potentially leading to costly damage of electronics. Thus, although liquid-cooled systems are smaller and more efficient than air-cooled systems, they also are associated with a higher level of risk.

Thus, there is a need in the art for a small, efficient and low-risk method and apparatus for chip cooling.

SUMMARY OF THE INVENTION

In one embodiment, the invention is a method and apparatus for chip cooling. One embodiment of a system for cooling a heat-generating device, such as a semiconductor chip, includes a vaporization chamber for at least partially vaporizing a stream of liquid in a stream of gas to produce a mixture of gas, vapor and liquid and a heat sink coupled to the vaporization chamber for transferring heat from the heat-generating device to the mixture.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for chip cooling. Embodiments of the present invention employ a vaporizer that vaporizes liquid in a gas stream prior to entry of the gas stream into a small heat sink. The mixture of gas, vapor, and liquid dispersion further evaporates on the fins of the heat sink, efficiently cooling the heat sink. The heat sink of the present invention thereby achieves cooling in a manner that is more efficient, less risky and less demanding of space than is possible using conventional systems. In further embodiments, the gas/vapor cooling system is implemented in a closed-loop circuit in which the liquid is condensed at a radiator or heat exchanger.

Figure 1:
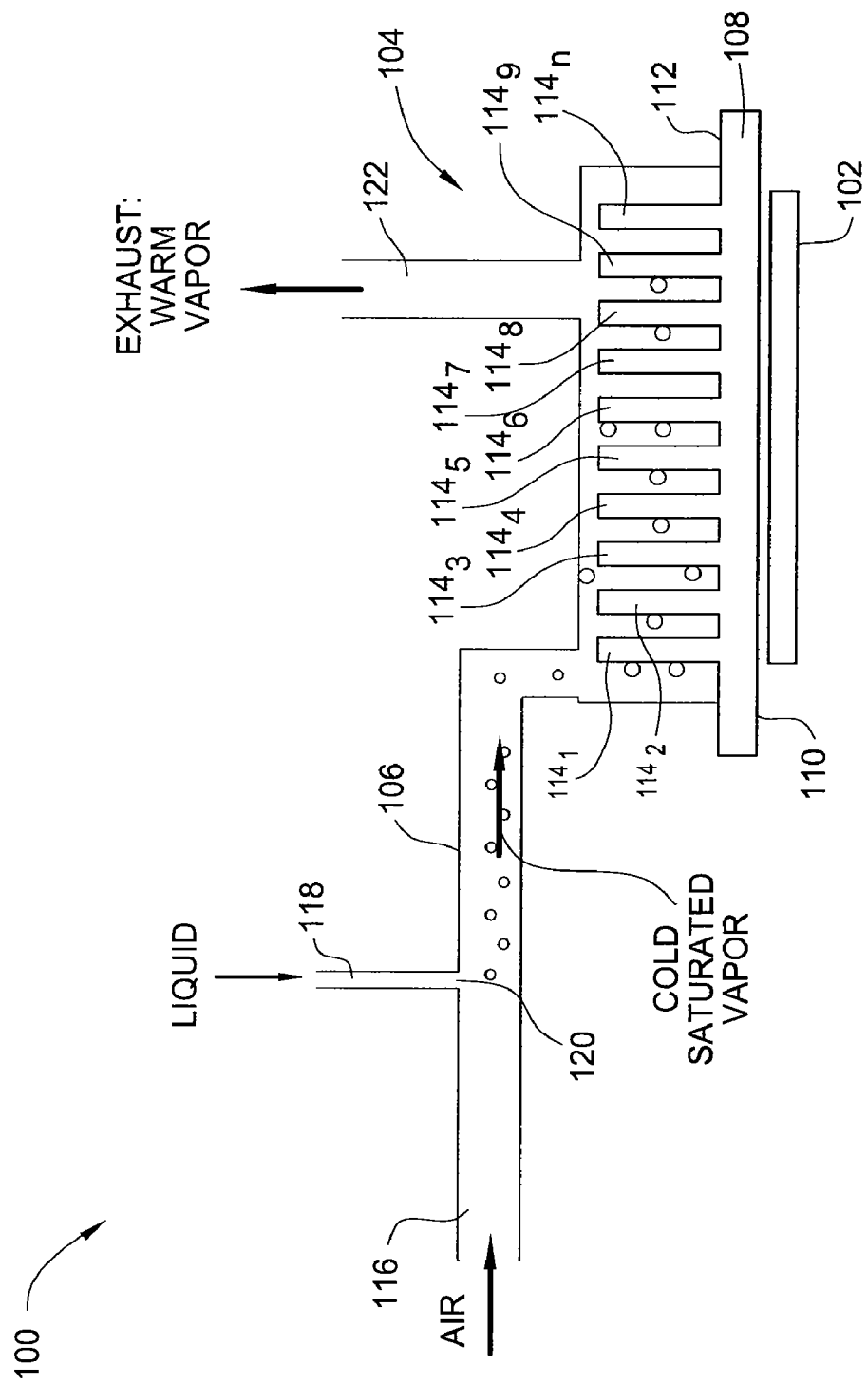
FIG. 1 is a schematic diagram illustrating one embodiment of a gas/vapor cooling system, according to the present invention.

FIG. 1 is a schematic diagram illustrating one embodiment of a gas/vapor cooling system 100, according to the present invention. The system 100 may be implemented, for example, to dissipate heat from a high-powered microprocessor chip. The system 100 comprises a heat sink 104 and a vaporization chamber 106 coupled to the heat sink 104.

The heat sink 104 comprises a cold plate 108 having a first surface 110 and a second surface 112. The first surface 110 of the cold plate 108 is adapted to contact a heat-generating device 102, such as a microprocessor chip. The second surface 112 of the cold plate 108 comprises a plurality of fins $114_1$-$114_n$ (hereinafter collectively referred to as "fins 114").

The vaporization chamber 106 comprises a gas inlet 116, a liquid inlet 118, a vaporizer 120 and an exhaust port 122. The gas inlet 116 provides a stream of gas to the vaporization chamber 106, while the liquid inlet 118 provides a stream of liquid to the vaporization chamber 106. The vaporizer 120 is positioned proximate to the liquid inlet 118. The exhaust port 122 is positioned proximate to the heat sink 104. As also illustrated, a portion of the vaporization chamber comprises a chamber portion that partially encloses the heat sink 104. The exhaust port 122 is coupled directly to this chamber portion.

The vaporizer 120 may accomplish vaporization using any one or more of a variety of methods, including, but not limited to: ultrasonic vaporization using piezoelectric elements, fluid mechanical vaporization using Venturi effect (carburetor) or jets, and droplet impact. In other embodiments, variants of this type of apparatus that can perform similar operations, such as nebulizers and atomizers, are used in place of a vaporizer.

In operation, the vaporizer 120 breaks the stream of liquid provided by the liquid inlet 118 into very fine droplets that at least partially evaporate in the stream of gas provided by the gas inlet 116. In one embodiment, the liquid comprises as least one of: water, alcohol, ammonia, Freon, liquid nitrogen, liquid carbon dioxide, or other liquid additives. In other embodiments, the liquid comprises a super-critical carbon dioxide fluid or a "dry snow", which is a mixture of a gas and small solid particles of carbon dioxide. In one embodiment the gas comprises at least one of various non-toxic gases, including air, oxygen, nitrogen and carbon dioxide. This evaporation process reduces the temperature of the resultant mixture of gas, vapor and liquid droplets. The mixture is passed through the heat sink 104, and as the mixture flows through the fins 114 of the heat sink 104, heat is transferred from the heat generating device 102 to the mixture. Additional heat transfer occurs via further evaporation of liquid droplets on and/or between the fins 114 of the heat sink 104. The mixture (along with the heat transferred thereto) is removed from the system 100 by the exhaust port 122.

Because of the efficiency of evaporation of the small liquid droplets, the system 100 can be very small. In systems where gas can be flown to the fins at very high speed (e.g., on the order to ten meters per second or more), impingement of fluid droplets on the fins can be achieved, which yields additional very efficient heat transfer. Thus, the system 100 does not demand a great deal of space in a computer (or other) enclosure. In one embodiment, the lateral dimensions of the system 100 closely match the size of the heat-generating device 102. In another embodiment, the lateral dimensions of the chamber portion that partially encloses the heat sink 104 are chosen to closely match comparable dimensions of the heat sink 104, as illustrated in FIG. 1. In a further embodiment, the fins 114 of the heat sink 104 are chosen to be between approximately ¼ and approximately ½ inch tall, and the thickness and spacing of the fins 114 are between approximately 100 and 500 microns. Thus, the efficiency of a gas cooling system can be approximated in a system roughly the size of a liquid cooling system. Moreover, because the system 100 relies largely on vapor rather than liquid for actual cooling, the risk of leakage that is typically associated with liquid cooling systems is minimized.

Figure 2:
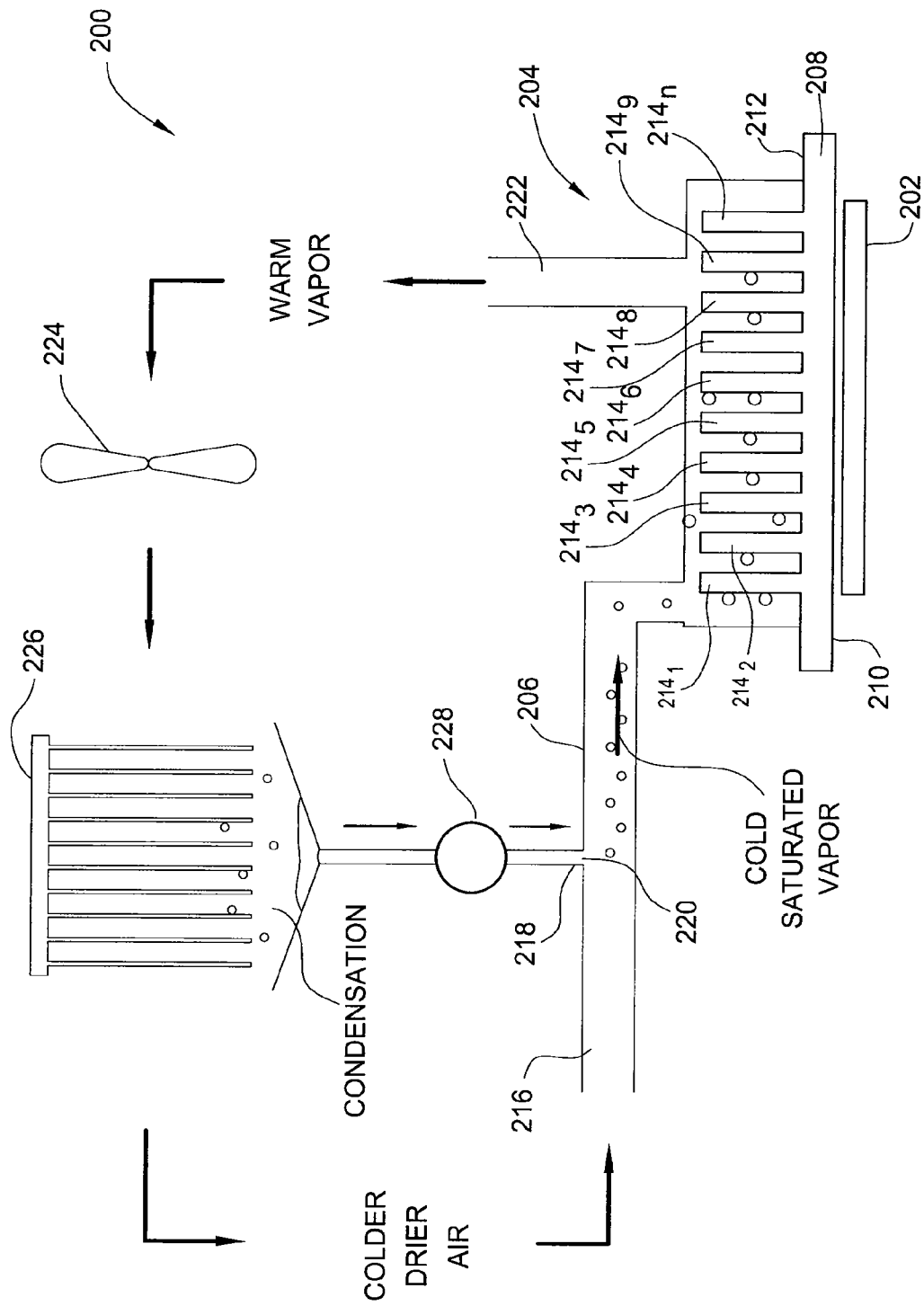
FIG. 2 is a schematic diagram illustrating a second embodiment of a gas/vapor cooling system, according to the present invention.

FIG. 2 is a schematic diagram illustrating a second embodiment of a gas/vapor cooling system 200, according to the present invention. Like the system 100 illustrated in FIG. 1, the system 200 may be implemented, for example, to dissipate heat from a high-powered microprocessor chip. Also like the system 100, the system 200 comprises a heat sink 204 and a vaporization chamber 206 coupled to the heat sink 204. In addition, the system 200 comprises a propeller (e.g., a fan or a turbine) 224 coupled to the heat sink 204, heat exchanger (e.g., a radiator) 226 with a condenser coupled to the propeller 224 and a path or channel from the heat exchanger 226 and to the vaporization chamber 206. In the embodiment illustrated in FIG. 2, the path is represented by a pump 228 coupled to the heat exchanger 226 and the vaporization chamber 206. In one embodiment, the heat exchanger 226 is disposed within the system being cooled (e.g., a computer system). In another embodiment, the heat exchanger 226 is disposed outside of the system being cooled.

The heat sink 204 comprises a cold plate 208 having a first surface 210 and a second surface 212. The first surface 210 of the cold plate 208 is adapted to contact a heat-generating device 202, such as a microprocessor chip. The second surface 212 of the cold plate 208 comprises a plurality of fins 214'-214, (hereinafter collectively referred to as "fins 214").

The vaporization chamber 206 comprises a gas inlet 216, a liquid inlet 218, a vaporizer 220 and an exhaust port 222. The gas inlet 216 provides a stream of gas to the vaporization chamber 206, while the liquid inlet 218 provides a stream of liquid to the vaporization chamber 206. The vaporizer 220 is positioned proximate to the liquid inlet 218. The exhaust port 222 is positioned proximate to the heat sink 204.

As described above, vaporization may be accomplished using any one or more of a variety of methods, including, but not limited to: ultrasonic vaporization using piezoelectric elements, fluid mechanical vaporization using Venturi effect (carburetor) or jets, and droplet impact. Moreover variants of a vaporizer-type apparatus that can perform similar operations, such as nebulizers and atomizers, may be used in place of a vaporizer.

In operation, the vaporizer 220 breaks the stream of liquid provided by the liquid inlet 118 into very fine droplets that at least partially evaporate in the stream of gas provided by the gas inlet 216. In one embodiment, the liquid comprises at least one of: water, alcohol, ammonia, Freon, liquid nitrogen, liquid carbon dioxide, or other liquid additives. In other embodiments, the liquid comprises a super-critical carbon dioxide fluid or a "dry snow", which is a mixture of a gas and small solid particles of carbon dioxide. In one embodiment the gas comprises at least one of various non-toxic gases, including air, oxygen, nitrogen and carbon dioxide. This evaporation process reduces the temperature of the resultant mixture of gas, vapor and gas droplets. The mixture is passed through the heat sink 204, and as the mixture flows through the fins 214 of the heat sink 204, heat is transferred from the heat generating device 202 to the mixture. Additional heat transfer occurs via further evaporation of liquid droplets on and/or between the fins 214 of the heat sink 204. The mixture (along with the heat transferred thereto) is removed from the system 200 by the exhaust port 222.

The warm vapor exiting the exhaust port 222 is conveyed by the propeller 224 to the heat exchanger 226, where the warm vapor is cooled and at least partially dried. The pump 228 provides enough pressure to operate the vaporizer 220 in an appropriate regime, where at least a portion of the liquid is directed or forced through a nozzle and broken into a plurality of small droplets. Alternatively, the liquid can be directed to the vaporizer by other means, such as gravity, capillary or Venturi force, and be vaporized in any one of more of the variety of methods described earlier herein. Thus, the system 200 can operate as a closed loop or partially closed loop circuit. A key distinction and advantage of the present invention with respect to standard refrigeration systems is that the liquid or gas can be separated and selectively recycled. By contrast, in a standard refrigeration system, the cooling medium is never dissociated.

The system 200 may confer advantages in addition to those realized by the system 100. For instance, the risk of leakage may be minimized further by the implementation of a loop that directs the liquid outside of the system being cooled. Leaks in the vapor circuitry will merely raise the ambient humidity level and are readily detected. Moreover, some level of cooling is maintained even if the vaporizer flow is reduced or stopped (e.g., during maintenance).

Figure 3:
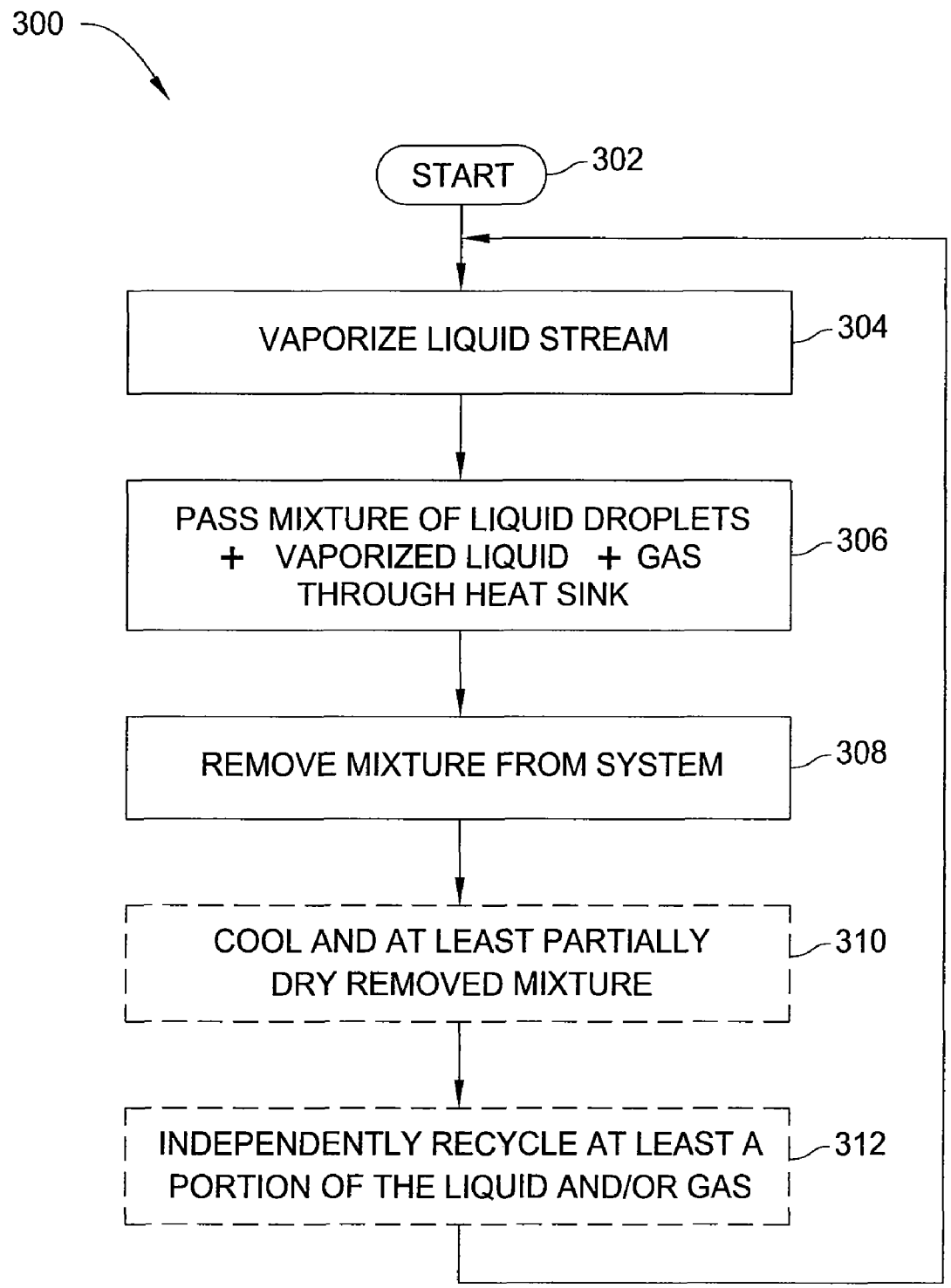
FIG. 3 is a flow diagram illustrating one embodiment of a method for cooling a heat-generating device.

FIG. 3 is a flow diagram illustrating one embodiment of a method 300 for cooling a heat-generating device. The method 300 may be implemented, for example, by a gas/vapor cooling system designed to cool heat-generating devices, such as high-powered microprocessor chips. The method 300 is initialized at step 302 and proceeds to step 304, where the method 300 vaporizes a stream of liquid into very fine droplets.

In step 306, the method 300 passes a mixture of the vaporized liquid, gas, and liquid droplets through a heat sink that is coupled to the heat-generating device. In step 308, the method 300 removes the mixture, along with any evaporated liquid droplets that have settled on the heat sink, from the system.

In optional step 310 (illustrated in phantom), the method 300 cools and at least partially dries the removed mixture of liquid, gas and gas droplets. In optional step 312 (illustrated in phantom), the method 300 independently recycles at least a portion of the liquid and/or at least a portion of the gas before returning to step 304 and again vaporizing the stream of liquid.

Thus, the present invention represents a significant advancement in the field of microprocessor chips. Embodiments of the present invention employ a vaporizer that vaporizes liquid in a gas stream prior to entry of the gas stream into a small heat sink. The cold saturated vapor further evaporates on the fins of the heat sink, efficiently cooling the heat sink. The heat sink of the present invention thereby achieves cooling in a manner that is more efficient, less risky and less demanding of space than is possible using conventional systems.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A system for cooling a heat-generating device, comprising:
    a vaporizer for at least partially vaporizing a stream of liquid in a presence of a stream of gas to produce a mixture of gas, vapor, and liquid;
    a heat sink adapted to be thermally coupled to the heat-generating device for transferring heat from the heat-generating device; and
    a chamber partially enclosing the heat sink and coupled to the vaporizer,
    wherein the vaporizer is external to the chamber and delivers the mixture of gas, vapor, and liquid to the heat sink to absorb the heat from the heat sink, and wherein the chamber has lateral dimensions that closely match comparable dimensions of the heat sink.

2. The system of claim 1, further comprising:
    a gas inlet for providing the stream of gas;
    a liquid inlet for providing the stream of liquid; and
    an exhaust port positioned proximate to the heat sink for removing the mixture from the system.

3. The system of claim 2, further comprising:
    a heat exchanger for cooling the mixture removed by the exhaust port; and
    a propeller positioned between the exhaust port and the heat exchanger, for conveying the mixture from the exhaust port to the heat exchanger.

4. The system of claim 1, further comprising:
    the stream of liquid, wherein the stream of liquid comprises alcohol.

5. The system of claim 1, further comprising:
    the stream of liquid, wherein the stream of liquid comprises ammonia.

6. The system of claim 1, further comprising:
    the stream of liquid, wherein the stream of liquid comprises Freon.

7. The system of claim 1, further comprising:
    the stream of liquid, wherein the stream of liquid comprises liquid nitrogen.

8. The system of claim 1, further comprising:
    the stream of liquid, wherein the stream of liquid comprises liquid carbon dioxide.

9. The system of claim 1, further comprising:
    the stream of liquid, wherein the stream of liquid comprises supercritical carbon dioxide fluid.

10. The system of claim 1, further comprising:
    the stream of liquid, wherein the stream of liquid comprises a dry snow.

11. The system of claim 1, further comprising:
    the stream of gas, wherein the stream of gas comprises oxygen.

12. The system of claim 1, further comprising:
    the stream of gas, wherein the stream of gas comprises nitrogen.

13. The system of claim 1, further comprising:
    the stream of gas, wherein the stream of gas comprises carbon dioxide.

14. The system of claim 1, wherein the heat sink comprises:
    a cold plate having a first surface adapted for contacting the heat-generating device and a second surface opposite the first surface; and
    a plurality of fins coupled to the second surface.

15. The system of claim 1, wherein the heat-generating device is a microprocessor chip.

16. A method for cooling a heat-generating device, the method comprising:
    vaporizing at least partially a stream of liquid in a presence of a stream of gas using a vaporizer to produce a mixture having components of gas, vapor, and liquid;
    transferring heat from the heat-generating device to a heat sink that is thermally coupled to the heat-generating device, the heat sink being partially enclosed within a chamber that is coupled to the vaporizer; and
    delivering the mixture via the vaporizer to the heat sink so that the mixture absorbs the heat from the heat sink,
    wherein the chamber has lateral dimensions that closely match comparable dimensions of the heat sink.

17. The method of claim 16, further comprising:
    removing the mixture from the chamber via an exhaust port positioned proximate to the heat sink, after delivering the mixture to the heat sink.

18. The method of claim 16, wherein the heat-generating device is a microprocessor chip.

* * * * *